United States Patent [19]
Fleet et al.

[11] Patent Number: 4,821,614
[45] Date of Patent: Apr. 18, 1989

[54] PROGRAMMABLE MAGNETIC REPULSION PUNCHING APPARATUS

[75] Inventors: Russell W. Fleet, Walden; David C. Long; Karl F. Stroms, both of Wappingers Falls; Gerhard Weiss, LaGrangeville, all of N.Y.

[73] Assignee: International Business Machines Corporation, Armonk, N.Y.

[21] Appl. No.: 140,971

[22] Filed: Jan. 6, 1988

Related U.S. Application Data

[63] Continuation of Ser. No. 837,933, Mar. 10, 1986, abandoned.

[51] Int. Cl.$^4$ .......................... B26D 7/18; B26D 5/08
[52] U.S. Cl. ........................................ 83/100; 83/365; 83/367; 83/371; 83/402; 83/409; 83/548; 83/552; 83/575; 83/588; 101/93.48
[58] Field of Search ................... 83/71, 98, 100, 365, 83/367, 402, 577, 588, 548, 552, 575, 73, 371, 409; 336/60, 55, 57, 58, 59; 101/93.48

[56] References Cited

U.S. PATENT DOCUMENTS

| | | | |
|---|---|---|---|
| 652,027 | 6/1900 | Johannesen | 336/60 |
| 3,351,740 | 11/1967 | Heuer | 83/365 |
| 3,730,039 | 5/1973 | Fedrigo | 83/575 |
| 3,822,622 | 7/1974 | Smith et al. | 83/100 |
| 3,964,355 | 6/1976 | Daniels | 83/402 |
| 4,165,669 | 8/1979 | Brown et al. | 83/552 |
| 4,319,849 | 3/1982 | Dollenmayer | 101/93.48 |
| 4,393,769 | 7/1983 | Landon et al. | 101/93.48 |
| 4,423,675 | 1/1984 | Luo et al. | 101/93.04 |
| 4,425,829 | 1/1984 | Kranik et al. | 83/62.1 |
| 4,538,493 | 9/1985 | Perazzolo et al. | 83/530 |
| 4,596,359 | 6/1986 | Nordli | 234/107 |
| 4,628,578 | 12/1986 | Yajima | 83/367 |
| 4,678,355 | 7/1987 | Gabor et al. | 101/93.48 |

FOREIGN PATENT DOCUMENTS 615573  2/1961  Canada .................... 83/577

OTHER PUBLICATIONS

IBM TDB, vol. 20, No. 4, Sep. 1977, p. 1379.
IBM Technical Disclosure Bulletin, vol. 20, No. 4, pp. 1379-1380.
IBM TDB, vol. 26, No. 7B, Dec. 1983, p. 3570.
IBM TDB, vol. 21, No. 11, Apr. 1979, p. 4473.
IBM TDB, vol. 13, No. 9, Feb. 1971, p. 2536.

*Primary Examiner*—Frank T. Yost
*Assistant Examiner*—Scott A. Smith
*Attorney, Agent, or Firm*—Ira David Blecker

[57] ABSTRACT

A punch apparatus for punching holes in thin sheet material including a frame, a punch element mounted on the frame for rectilinear movement, which further includes a planar element of conductive material mounted on the punch element, a coil on the frame mounted adjacent to the planar element, a carriage for supporting and positioning the sheet in the path of the punch element, leads connected to a source of electric current to energize the coil, a mechanical arrangement to rebound the punch element, and a programmable apparatus to selectively move the carriage and energize the coil to thereby produce a punched hole pattern in the sheet.

28 Claims, 5 Drawing Sheets

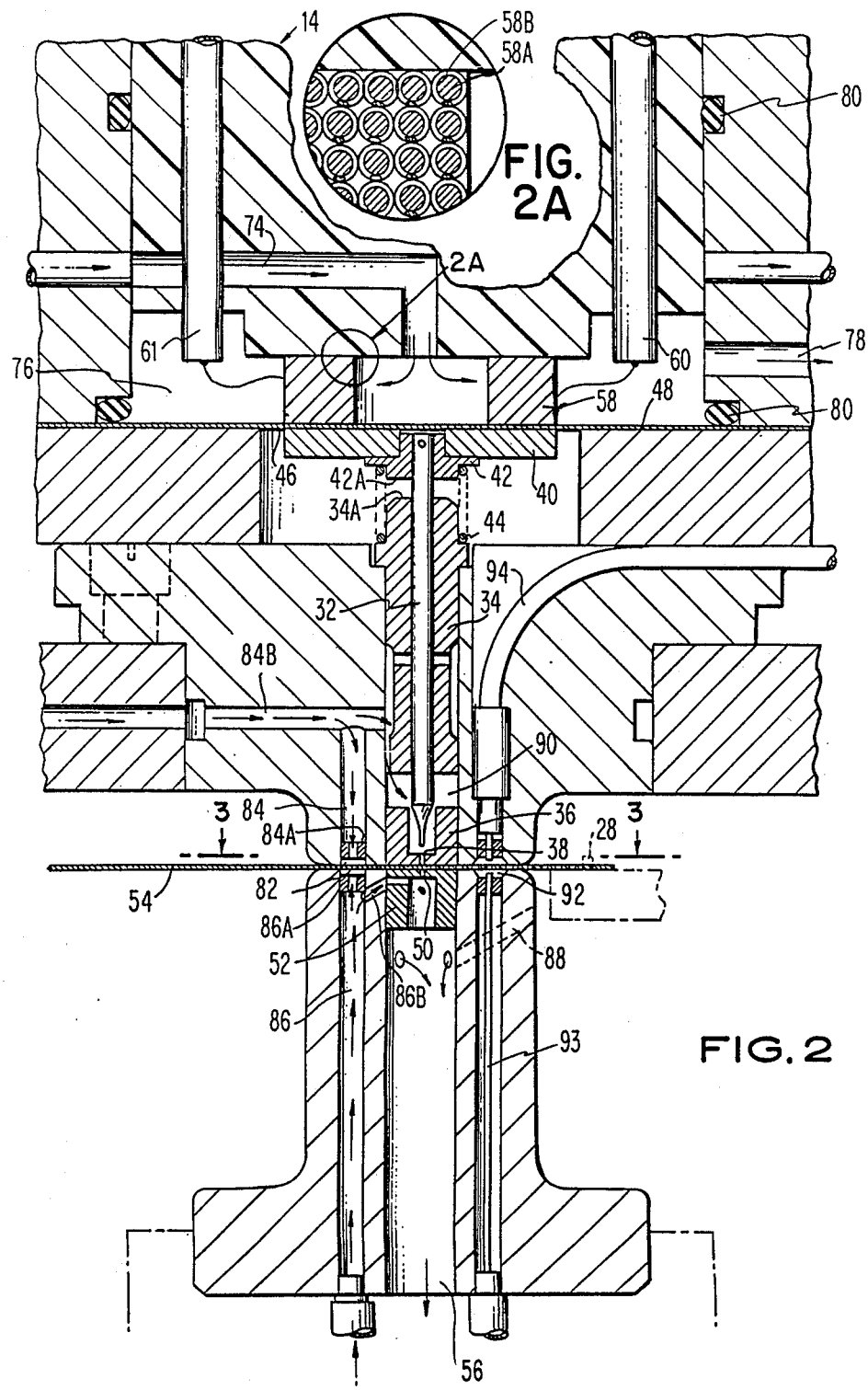

PROGRAMMABLE MAGNETIC REPULSION PUNCHING APPARATUS

This application is a continuation of application Ser. No. 837,933, filed Mar. 10, 1986, now abandoned.

TECHNICAL FIELD

This invention relates to punch apparatus for punching very small holes in thin sheet material, more particularly, to a programmable punch for forming holes in sheet material such as green ceramic sheet.

DESCRIPTION OF PRIOR ART

In the manufacture of multilayer ceramic (MLC) substrates for integrated circuit semiconductor package structures, a plurality of green ceramic sheets is formed by doctor blading a slurry containing a resin binder, a particulate ceramic material, solvents, and a plasticizer, drying the doctor bladed sheet and cutting it into appropriate sized sheets. Via holes are then punched for forming electrical interconnections through the sheet. Electrically conductive paste is deposited in the holes, and in appropriate patterns on the surface o the sheets, the sheets stacked and laminated, and the assembly subsequently fired at a sintering temperature. Punching the via holes in ceramic sheets presents formidable engineering problems in view of their small size and density and the complex hole patterns needed. It is conventional to punch via holes with apparatus of the type disclosed in IBM Technical Disclosure Bulletin Vol. 13, No. 4, Feb. 13, 1971 P. 2536, or IBM TDB Vol. 16, No. 12, May 1974 P. 3933 and U.S. Pat. No. 4,425,829. In these apparatus a plurality of punch elements arranged in the grid on a punch head are indexed over the green sheet which is covered by interposer mask. The interposer mask contains openings where holes are desired to be punched. When the punch elements contact the interposer mask as the punch head is moved downwardly a hole will be punched where the openings occur since the punch element will pass through the openings in the interposer mask, and through ceramic green sheet. In other areas covered by the interposer mask, i.e. where holes are not desired, the interposer mask will cause the punch element to be retracted into the head.

Automated punch apparatus which utilize individually programmable punches have been suggested in IBM Technical Disclosure Bulletin Vol. 20 No. 4, September 1977 P. 1379. This type of punching apparatus does not require the aforedescribed interposer mask, since the individual punching elements can be activated electrically upon command. In this apparatus, as in the punch apparatus that uses an interposer mask, a punch head is used which includes punch elements for each sector of the sheet to be punched. A punch head can have as many as 100 individual punch elements. In the programmable punch head, selected punches are extended with a solenoid and the entire head moved downwardly as a unit to punch the holes. The punches that have been moved into extended positions punch holes in the sheet. The others in retracted positions do not penetrate the sheets and therefor do not form holes. The support for the green sheet must stop during the punching stroke in order to avoid breaking the punch elements. In addition the general overall geometry of the hole pattern is dictated by the geometry of the punch head. The punch hole pattern cannot be conveniently expanded or contracted even though the hole pattern can be changed.

A high velocity punch that uses magneto repulsive actuator for driving a punch element through a workpiece is shown in U.S. Pat. No. 3,730,039.

DISCLOSURE OF INVENTION

In accordance with the present invention, we provide improvements in punch apparatus for punching holes in sheet material, in particular a green ceramic sheet material. More specifically, the invention is a programmable punch apparatus for punching hole patterns in thin sheet material that includes a frame, a punch element mounted on the frame for rectilinear movement, with a substantially planar element of highly conductive material mounted on the punch element normal to the direction of movement, a planar coil fixably mounted on the frame that is coaxial with the planar element and adjacent thereto, a carriage means for positioning a thin sheet of material in the path of the punch element, and moving the sheet material in directions transverse to the axis of the punch element, a means for energizing the coil with a low frequency pulse of electrical energy for generating flux linking the conductive element to repel the element from the coil, and a means to rebound the punch element immediately after the end portion generates the sheet. A programmable means is provided to selectively move the carriage means to specifically locate the sheet supported thereon relative to the punch element, and to activate the means for energizing the coil to thereby produce a predetermined punch hole pattern in the sheet.

BRIEF DESCRIPTION OF DRAWINGS

In the accompanying drawings forming a material part of this disclosure,

FIG. 2 and FIG. 2A are cross-sectional view in cross-section of the punch apparatus of the invention illustrating the elements thereof.

BEST MODE FOR CARRYING OUT THE INVENTION

Figure 1:
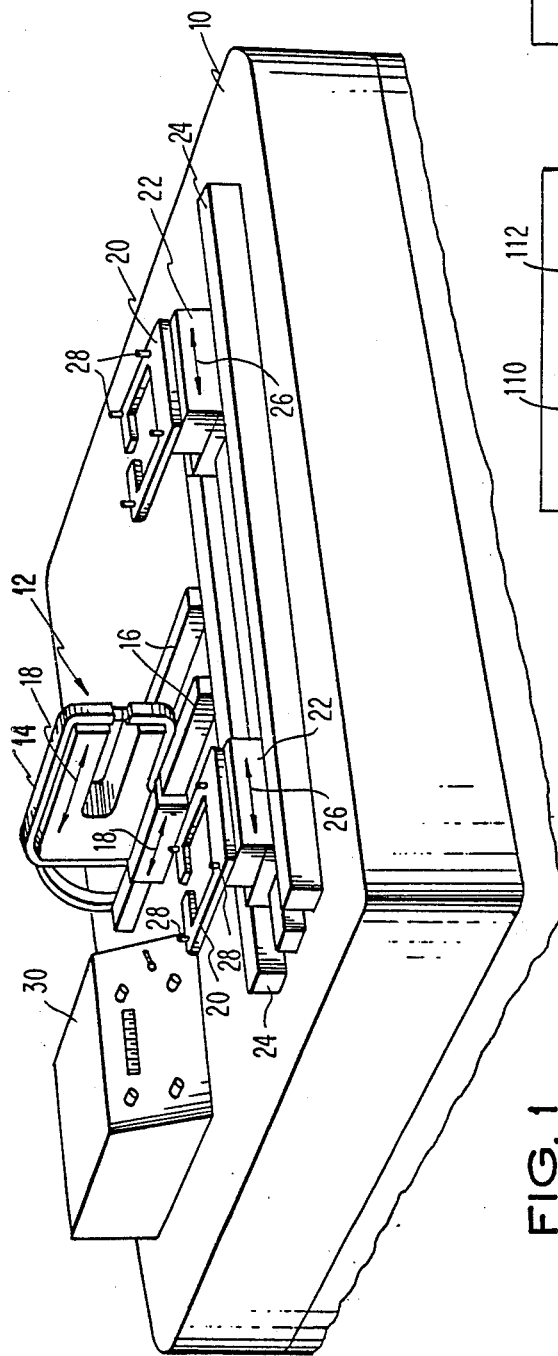
FIG. 1 is a prospective view of the overall apparatus of the invention illustrating the general relationship between the punch apparatus and the support for the sheet material.

Referring now to the drawing, there is illustrated a punch apparatus of the invention. As shown in FIG. 1, a bench or table 10 supports the punch apparatus 12, which includes a punch 14 mounted for movement on rail 16 in the direction indicated by arrow 18, and a sheet workpiece support mounted on carriage 22, in turn mounted on rails 24 for movement in the directions indicated by arrow 26. Preferably two sheet support elements 20 are provided, both of which are mounted for support on rails 24. Suitable alignment pins 28 are provided on sheet support 20 to hold a sheet to be punched that is provided with alignment holes. The control panel 30 is provided with suitable controls to operate the punch apparatus 12.

Referring to FIG. 2 of the drawings, there is illustrated the detailed structure of punch 14. A punch element 32 is mounted for rectilinear movement on bushing 34 and punch guide block 36, with the punch element end of reduced diameter aligned with hole 38 in block 36. The end of punch element 32 is withdrawn from hole 38 when it is in retracted position as indicated in FIG. 2. A planar element 40 of electrically conductive material is mounted on collar 42 in turn secured to the upper end of punch element 32. Spring 44 seated on abutment surfaces on bushing 34 and collar 42 support the weight of the punch element and attached elements to urge it into contact with an abutment surface 46 of sheet 48. The lower end of punch 32 is aligned with hole 50 in punch die 52. When the punch element 32 is actuated downwardly, the lower end will penetrate the workpiece sheet 54, form a hole, and the end of the punch enter hole 50 in punch docket 52. The punched out material, i.e. the slug, will fall downwardly into chamber 56.

Figure 8:
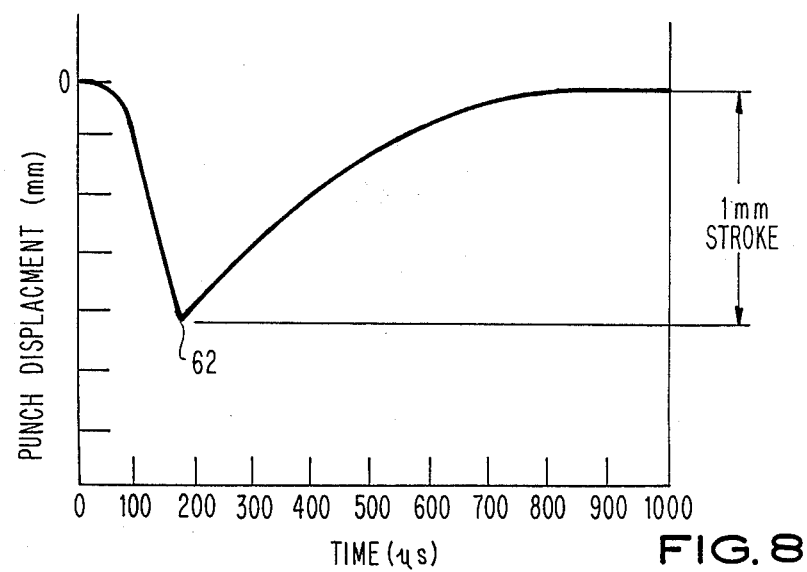
FIG. 8 is a graph showing the relationship between the punch displacement and time.

The punch element 32 is driven through the workpiece sheet 54 by magneto repulsion. A planar high energy coil 58 is mounted above plate 48 in close proximity to planar element 40. Leads 60 and 61 are connected to a suitable source of electric current. The current going through coil 58 produces a magnetic field that links with the planar disk 40 inducing a current that is substantially of opposite phase with the current flowing through the coil 58. This current in the disk 40 produces a magnetic field which opposes the field in coil 58. A force results from the two opposing magnetic fields which drives the disk 40 away from fixed coil 58. The force is proportional to the number of turns in coil 58, the time varying currents in the coil and disk as well as other physical parameters of the system. In the preferred embodiment a force of approximately 30 pounds is generated. This high force combined with a low moving mass yield a very high speed punch drive system. The movement of punch element 32 is terminated when the surface 42A of collar 42 strikes the surface 34A of bushing 34 and is rebounded. The pulse of electrical current passed through coil 58 is of a magnitude to produce a very rapid acceleration of the punch 32 away from coil 58. The punch displacement is indicated by the plot of punch displacement versus time in FIG. 8. The punch element 32, as indicated in FIG. 8, is very rapidly accelerated during the first 100 micro seconds. Thereafter for about another 100 micro seconds the velocity of the punch is constant, as indicated by the constant slope of the curve. The inflection point 62 indicates the point of rebound where the punch travels upwardly at only slightly less velocity. As the punch approaches the initial upward position, its velocity is markedly decreased. This dampening effect is produced by the air that is momentarily trapped between the planar element 40 and the flat surface 46. The spring 44 is provided solely to hold the planar element 40 against the surface 46. The high return velocity is achieved by the rebounding of collar 42 on bushing 34. The very high rebound velocity of the punch serves to eject the slug of material from the punch end. The inertia of the slug causes it to detach itself from the punch element and continue downwardly.

Figure 7:
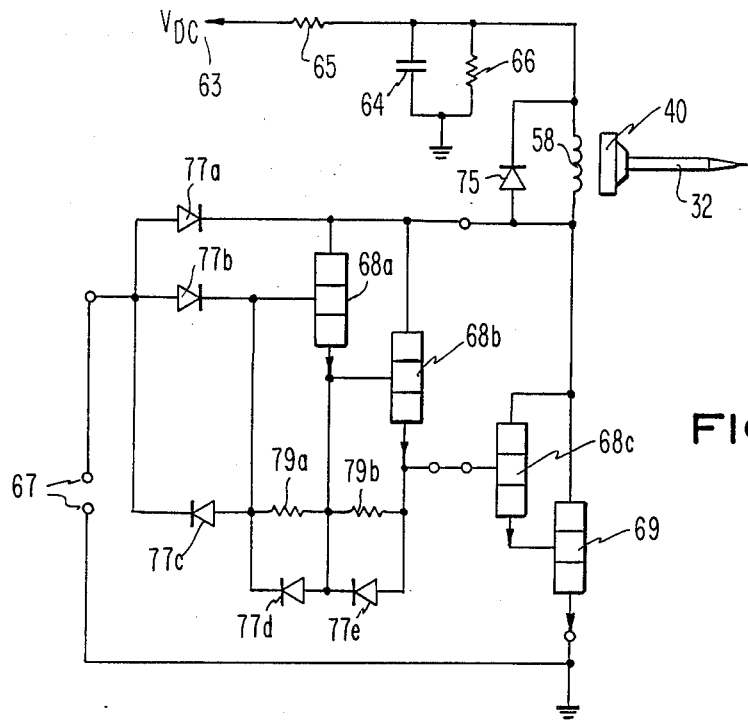
FIG. 7 is an electrical circuit diagram of a circuit that can be used to actuate the punching apparatus of the invention.

Referring now to FIG. 7 of the drawings, there is depicted a circuit suitable for actuating punch 32 by applying a current pulse to coil 58. An external DC power supply 63 typically 100V, charges the main energy storage capacitor 64 through resistor 65. Resistor 66 is a bleeder resistor to discharge capacitor 64 and is provided for safety reasons. A positive input drive signal from the control is applied across terminals 67 when a punch stroke is called for. The pulse signal is amplified by transistors 68A, 68B, and 68C, to turn on transistor 69 in turn connected to ground. This effectively connects drive coil 58 to capacitor 64. The current in coil 58 gradually increases to produce a punch stroke. The maximum current in the coil is determined by the coil and circuit DC resistance. By applying a negative drive signal across terminals 67, transistors 68A, 68B, 68C and 69 are turned off and the coil 58 effectively disconnected from capacitor 64. Disconnecting coil 58 from capacitor 64 causes the current in coil 58 to decay by flowing through diode 75. Diodes 77A, 77B, 77C, 77D and 77E, and resistors 79A and 79B are included in the circuit to insure a fast turn on and turn off of the associated transistors.

Figure 6A:
FIGS. 6A, 6B, 6C and 6D illustrate various embodiments of a feature of the coil of the invention.
Figure 6B:
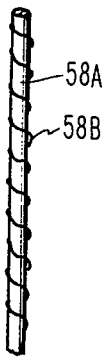
Figure 6C:
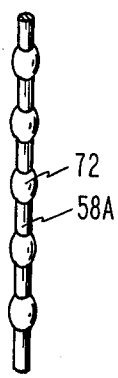
Figure 6D:
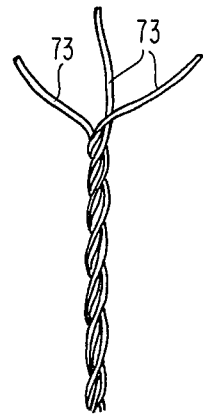

In order to achieve the high velocity of the punch element, a very large pulse of electrical current must be passed through the coil 58. This requires that it be cooled, normally by liquid cooling. In order to achieve the sufficient coolant flow, the windings 58A must be spaced by suitable spacers 58B, as indicated in the detailed drawing FIG. 2A associated with FIG. 2. The spacing of the windings of coil 58 can be achieved by any of the structures shown in FIGS. 6A through 6D. In the embodiment of FIG. 6A the winding 71 has a non-circular cross-section, for example a square or rectangular cross-section, and the winding twisted into a convoluted shape. When the winding is formed into a coil, the resulting coil is porous to circulating fluid. In the embodiment of FIG. 6B a line 58B of dielectric material, for example, nylon, is wound about the winding 58A, typically a copper wire to provide a spacing means. In the embodiment of FIG. 6C, spaced annular beads 72 of dielectric material are disposed about the winding 58A. In the embodiment of FIG. 6D a plurality of wires 73 are twisted or braided together to form a porous wire.

In a preferred structure for passing cooling fluid through coil 58, the liquid is passed radially through the windings. As shown in FIG. 2, an inlet passage 74 introduces cooling liquid to the center of coil 58. The pressure forces the liquid radially through the windings where it is collected in chamber 76 and exited out passage 78. Annular seals 80 are provided to prevent coolant leakage out of chamber 76.

Figure 3:
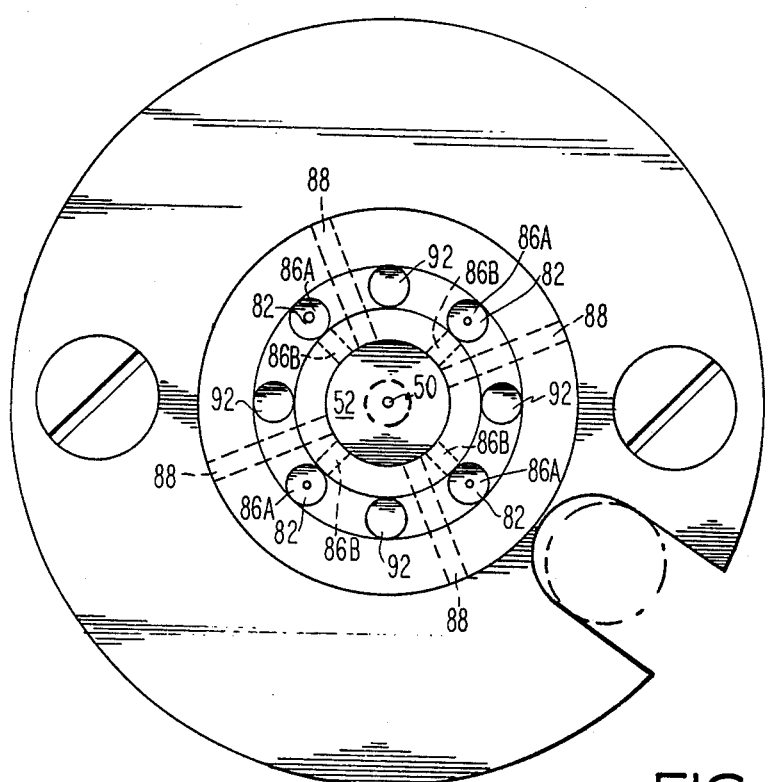
FIG. 3 is a top view taken on line 3—3 of FIG. 2.

In order to better support the workpiece sheet 54 over punch die 52, a plurality of air bearings 82 are provided around punch element 32, as indicated in FIG. 3. Each air bearing consists of air passages 84 and 86 with the ends thereof in aligned and opposed relation. Compressed air from the passages passed through bushings 84A and 86A respectively and are directed against opposite sides of workpiece sheet 54. A smaller branch air passage 86B connected to passage 86 directs air at the lower end of opening 50 in punch die to assist in removing slugs of punched material from the punch element 32 upon completion of the punch stroke. Preferably a vacuum source is connected to chamber 56 to draw additional air through openings 88 to remove slugs of material and other debris.

An additional branch passage 84B in passage 84 is connected to chamber 90. By this arrangement, air is forced through opening 38 in bushing 34 and through the punch hole in sheet 54 following completion of the punch cycle. The air under pressure blows the slug of material that may have lodged in the die or sheet when the punch element was withdrawn.

In order to check for the presence or absence of punched holes in sheet 54, a plurality of hole sensors 92 are provided about the punch element 32 as indicated in FIGS. 2 and 3. The hole sensor 92 consists of a pair of fiber optic cables 93 and 94 with the ends arranged in opposed and aligned relation on opposite sides of sheet 54. One of the cables i.e. 94, is connected to a light source, and the other cable 93 connected to a light sensor. When a hole in sheet 54 is aligned with the ends of fiber optic cables 93 and 94, the light sensor will detect light, and indicate the presence of a hole. When no hole exists, the light is blocked by the sheet which is also detectable by the sensor. A suitable hole verifier control keeps track of the hole positions in the punch sheet and when the hole position are aligned with the ends of the detector. This allows the punch hole pattern to be checked simultaneously as the adjacent holes are being punched.

Figure 4:
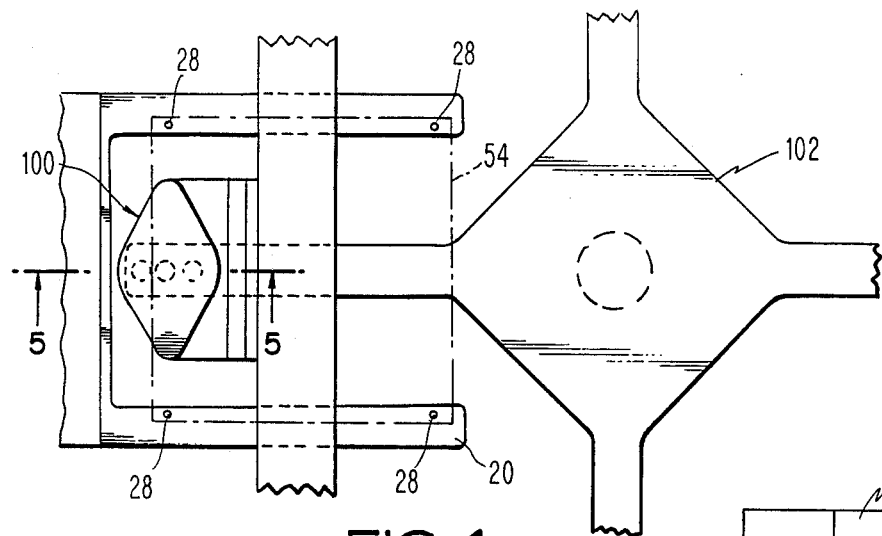
FIG. 4 is a detailed view in broken section that illustrates a rotatable head for supporting the punch element which is a preferred alternate specific embodiment of the invention.
Figure 5:
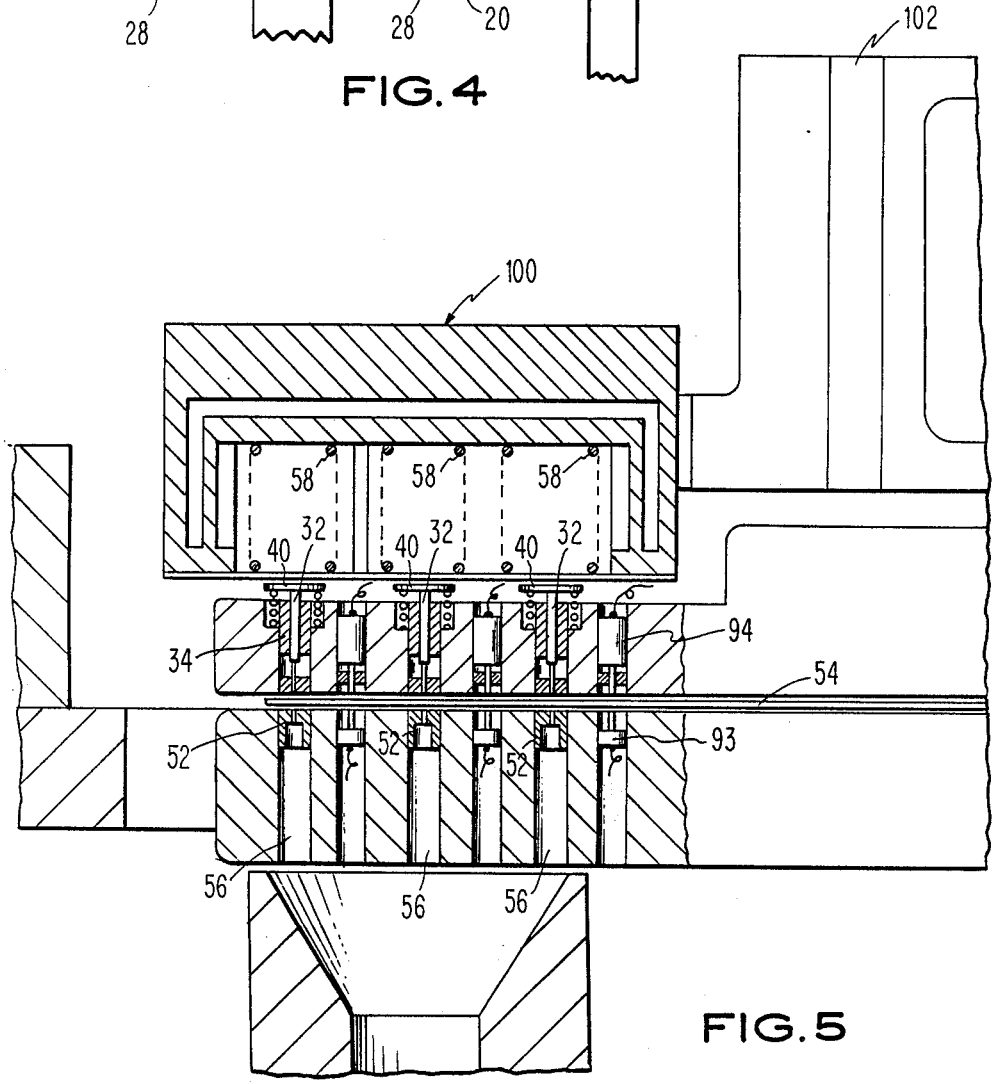
FIG. 5 is a sectional view taken on line 5—5 of FIG. 4.

In FIGS. 4 and 5 there is illustrated a modification of the original punch apparatus of the invention. In this embodiment the punch head 100 contains a plurality of punch elements 32, and the associated elements that make it operate. The multiple punch head is indexed over the sheet workpiece to punch holes as in the previously described punch apparatus. However, with multiple punches in the head, the number of holes that can be punched is greater. Another modification is mounting the punch head 100 on a spider 102 so that the head can be rotated into and out of punching position. The spider permits multiple heads to be mounted for instant use with the workpiece support apparatus. In operation, the punch must be serviced periodically to replace worn punches, etc. A serviced punch head can be held in reserve and rotated into operating position in the event of a malfunction of the head or the need of periodic servicing. This prevents a prolonged shut down of the apparatus. The spider element can be mounted for movement to shift the punch head over the workpiece surface.

The aforedescribed punch apparatus is particularly adapted to punch hole patterns in green ceramic in the production of multi layer ceramic substrates for semiconductor modules of the type described in U.S. Pat. No. 4,245,273. In such applications the diameter of the holes is very small, on the order of 5 to 6 mils. The distance between holes varies but can be as close as 10 mils. The ceramic sheet thickness is normally from 8 to 11 mils. In operation, the hole pattern is controlled by a program. The rapidity of the punch stroke is such that the motion of the sheet need not be stopped during the punch stroke. The punch is engaged with the green sheet, i.e. when the punch enters and leaves the sheet for about $10^{-4}$ seconds. The sheet support means moves about $10^{-4}$ inch during the time interval. This movement is accommodated by the plasticity of the green sheet and possibly a slight flexure of the punch.

Figure 9:
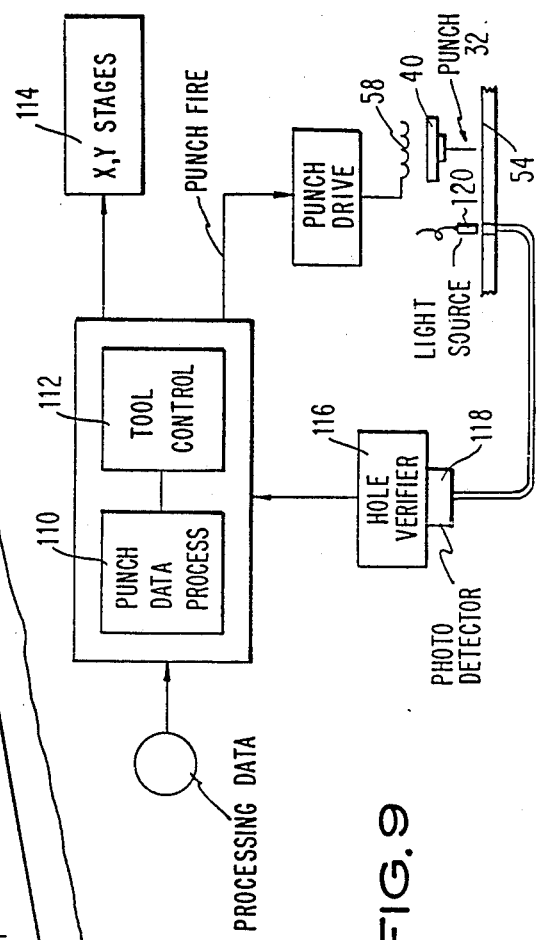
FIG. 9 schematic diagram of the control means for controlling the various elements of the punch apparatus of our invention.

Referring now to FIG. 9, there is depicted a schematic diagram of a control means that is part of the punch apparatus of the invention. Processing data, which includes the hole pattern configuration and the amount the pattern must be expanded to compensate for sintering shrinkage of the substrate is transformed into a matrix that is suitable for scanning in the X and Y directions in the punch data process unit 110. A list of hole coordinates is sent to tool control 112 as punch data. Tool control takes the X and Y hole coordinates and generates instructions for moving the X and Y stages 114 that support and move the workpiece sheet to be punched relative to the punch element 32. More specifically, control 112 coordinates the X movement of the table supporting the punch tool 14 and the Y stepping movement of carriage 22. The tool control 112 also generates firing signals for the coil 58 that are coordinated with the instructions for moving the X and Y stages. A punch hole verifier 116 coordinates signals from a photo detector with punch instructions and X and Y stage location data to verify that holes were punched and are clear of debris, etc. The verification, like the punch operation, is accomplished without stopping the continuous movement of the sheet relative to the punch element. The photo detector 118 is responsive to light from light source 120 that passes through a hole in sheet 54 and is conveyed through a fiber optic cable.

In addition, the quality of the holes punched in the green sheet by this apparatus is improved. The green ceramic material has visco elastic properties. When the punch speed is relatively slow it has a tendency to flow about the punch element during the downward punch stroke and subsequently cause sheet distortion. When the punch velocity is very high, as with this punch apparatus, on the order of 10 meters/sec, the green sheet material reacts as if it were brittle material. This results in reduced sheet distortion.

While the invention has been illustrated and described with reference to preferred embodiments thereof, it is to be understood that the invention is not limited to the precise construction herein disclosed and the right is reserved to all changes and modifications coming within the scope of the invention as defined in the appended claims.

We claim:

1. A programmable punch apparatus for punching hole patterns in thin sheet material including a frame, and a punch element mounted on said frame for rectilinear movement, comprising:
   a punch element;
   a collar element directly mounted on said punch element;
   a substantially planar element of highly conductive material directly mounted on said collar element normal to the direction of movement, wherein the diameter of said planar element is substantially greater than the diameter of said collar;
   a planar coil fixedly mounted on said frame of said punch apparatus coaxially with said punch element and adjacent to said planar element,
   carriage means for positioning a thin sheet of material to be punched in the path of said punch element, and moving said sheet material in directions transverse to the axis of said punch element,
   means for energizing said coil with a pulse of electrical energy for generating flux linking said conductive planar element to repel said planar element from said coil, a means to rebound said punch element, at least a part of which is affixed to said punch element, programmable means to selectively move said carriage means to specifically locate said sheet relative to said punch element, and activate said means for energizing said coil to thereby produce a predetermined punched hole pattern in said sheet.

2. The punch apparatus of claim 1 wherein said means to rebound said punch element changes the direction of travel of the punch element immediately after the punch end penetrates said sheet material.

3. The punch apparatus of claim 2 wherein said means to rebound said punch element includes said collar element comprised of elastic material fixed to said punch element, and a bushing element of elastic material on said frame that slideably supports said punch element, said collar element and said bushing element positioned to abut and contact each other after the end of the punch element penetrates said sheet material.

4. The punch apparatus of claim 2 wherein said means to rebound said punch element includes said collar element fixed to said punch element, and a bushing element on said frame that slideably supports said punch element, said collar element and said bushing element positioned to abut and contact each other after the end of the punch element penetrates said sheet material, wherein said collar element and said bushing element are formed of hardened steel.

5. The punch apparatus of claim 2 which further includes a spring element concentric about said punch element to hold said planar element against said planar coil between punch operations.

6. The punch apparatus of claim 2 which further includes a means to dampen the movement of the punch element upon completion of the punch stroke following the rebound.

7. The punch apparatus of claim 6 wherein said means to dampen the movement of the punch element is comprised of a flat abutment surface opposed to said planar element on said punch element, said abutment surface having an area at least as great as the area of said planar element, the dampening effect achieved by the momentary entrapment of air between said flat abutment surface and said planar element.

8. The punch apparatus of claim 1 which further includes punch die on said frame that receives the end of said punch element upon completion of the punch stroke, and a support means for said sheet material adjacent said punch die.

9. The punch apparatus of claim 8 wherein said support means for said sheet material is comprised of at least one first air bearing positioned adjacent said punch die.

10. The punch apparatus of claim 9 which a punch guide block for supporting the end of the punch element further includes a punch guide block for supporting the end of the punch element, at least one second air bearing in opposed relation to said first air bearing, the combination of said first and said second air bearings adapted in operation to support said sheet material between said punch die and said punch guide block.

11. The punch apparatus of claim 10 which includes a plurality of pairs of opposed air bearings located in surrounding relation to said punch die and punch guide block.

12. The punch apparatus of claim 8 which further includes a means to verify the integrity of the holes punched in said sheet material.

13. The punch apparatus of claim 12 wherein said means to verify punched holes is comprised of a light source, a fiber optic cable from said light source to a first support means positioned adjacent said punch die, a light sensor, a fiber optic cable from said light sensor to a second support means positioned in opposed relation to said first support means, the combination of elements capable of sensing the presence or absence of a hole in said sheet material, said programmable means including a means to determine whether or not a hole should exist at given locations, and means to compare the output of said light sensor with the data in said means to determine hole locations.

14. The punch apparatus of claim 8 which further includes a means to remove a punched slug of sheet material from the end of said punch element upon completion of the punch operation.

15. The punch apparatus of claim 14 wherein said means to remove a punched slug of material is comprised of a first closed chamber above said punch guide block, a source of pressurized air connected to said chamber, in operation the withdrawal of said punch element from said punch guide block, following a punching stroke, allowing pressurized air from said chamber to exit through said punch die and hole in said punched sheet material to forceably displace said punched slug potentially lodged in said sheet.

16. The punch apparatus of claim 14 wherein said means to remove a punch slug of material is further comprised of a second closed chamber beneath said punch die, a vacuum source connected to said second closed chamber, in operation, the withdrawal of said punch element from said punch die and sheet material causing air to be drawing through said die and sheet material to forceably remove slugs of material potentially lodged in said sheet.

17. The punch apparatus of claim 1 wherein said planar coil is comprised of a coil of electrically conductive wire with spacing means for maintaining a spacing between the individual wires of the coil, and a means to circulate cooling fluid between the spaced wires of the coil.

18. The punch apparatus of claim 17 wherein said spacing means is comprised of a thin line of dielectric material wound spirally on each electrically conductive wire.

19. The punch apparatus of claim 17 wherein said spacing means is comprised of spaced annular beads of dielectric material disposed about said electrically conductive wire.

20. The punch apparatus of claim 17 wherein said spacing means is comprised of conductive wire of said coil having a non-circular cross section that is twisted to form a convoluted configuration.

21. The punch apparatus of claim 17 wherein said spacing means is comprised of a plurality of conductive wires that are braided or twisted.

22. The punch apparatus of claim 1 wherein said carriage means is comprised of a pair of spaced rails located adjacent said frame, a stage mounted on said rails for movement parallel to said rails, a support for said sheet material mounted on said stage, and means to move said frame in a direction normal to said rails.

23. The punch apparatus of claim 1 wherein said carriage means moves said sheet material in a continuous movement as the punch element is actuated.

24. The punch apparatus of claim 1 wherein a plurality of punch elements are mounted on said frame, each of said punch elements being provided with a substantially planar element, a planar coil, a means for energizing said coil and a means to rebound said punch element so that each punch element is separately actuatable.

25. The punch apparatus of claim 1 which further includes spider element with at least 2 arms as part of said frame, punch elements mounted for rectilinear movement on each arm of said spider, said spider adapted to support a punch element in operative position relative to said carriage means, while holding another punch element in reserve.

26. The punch apparatus of claim 1 wherein said carriage means includes a stage for supporting a sheet of material to be punched that is movable relative to said punch element in a first direction, and a support means for said frame that is movable in a second direction normal to said first direction.

27. The punch apparatus of claim 7 wherein the diameter of said punch element is less than 8 mils, and the carriage means movement of said sheet material relative to said punch element is continuous.

28. The punch apparatus of claim 1 wherein said punch element punches a hole in said sheet in about 200 microseconds or less.

* * * * *